(12) United States Patent
Hwang et al.

(10) Patent No.: US 6,479,343 B1
(45) Date of Patent: Nov. 12, 2002

(54) DRAM CELL CAPACITOR AND MANUFACTURING METHOD THEREOF

(75) Inventors: Yoo-Sang Hwang, Suwon; Sang-Ho Song, Seoul; Byung Jun Park, Yongin; Tae Young Chung, Suwon, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/510,247

(22) Filed: Feb. 22, 2000

(30) Foreign Application Priority Data

Apr. 12, 1999 (KR) .......................................... 99-12801
Aug. 17, 1999 (KR) .......................................... 99-33767

(51) Int. Cl.[7] ......................................... H01L 21/8242
(52) U.S. Cl. ...................... 438/253; 438/256; 438/396; 438/399
(58) Field of Search .................. 438/240, 253, 438/254, 255, 396, 397, 398, 256, 399

(56) References Cited

U.S. PATENT DOCUMENTS 5,693,554 A * 12/1997 Lee .............................. 438/396
5,701,647 A * 12/1997 Saenger et al. ............. 438/396
5,741,722 A * 4/1998 Lee .............................. 438/240
5,793,076 A * 8/1998 Fazan et al. ................. 257/298
5,837,577 A * 11/1998 Cherng ........................ 438/253

OTHER PUBLICATIONS

S.P. Sim et al. "A New Planar Stacked Technology (PST) for Scaled and Embedded DRAMS", 597–600, 1996.

S. Nakamura, "A Simple 4 G–Bit DRAM Technology Utilizing High–Aspect, etc." 29–31, 1997.

* cited by examiner

Primary Examiner—Carl Whitehead, Jr.
Assistant Examiner—Toniae M. Thomas
(74) Attorney, Agent, or Firm—Lee & Sterba, P.C.

(57) ABSTRACT

A method for manufacturing a cell capacitor includes a step of forming an upper electrode and a trench for the lower electrode simultaneously in a single mask step. Further steps for manufacturing a cell capacitor includes forming a storage node contact by employing a predefined plate silicon layer and forming a capacitor dielectric using the storage contact node, as a result, it becomes possible to resolve "lift-off" problems, twin-bit failures, and misalignment.

14 Claims, 20 Drawing Sheets

DRAM CELL CAPACITOR AND MANUFACTURING METHOD THEREOF

BACKGROUND OF THE INVENTION

1. Field of the Invention

The present invention relates to a semiconductor device and a method for manufacturing a semiconductor device. More specifically, the present invention is directed to a dynamic random access memory (DRAM) cell capacitor.

2. Description of Background Art

For more than three decades, there has been a steady miniaturization of device dimensions being used for integrated circuit technology. As the chip density of memory cells increase, the area available for a capacitor of a DRAM storage cell (i.e., storage node) shrinks.

A relatively large capacitance is required for a high signal-to-noise ratio in a sense amplifier, and for the reduction of the soft errors due to alpha particle interference. Therefore there is a desire to reduce the cell dimension and yet retain a high capacitance, thereby achieving both high cell integration and reliable operation.

For example, it is known in the semiconductor manufacturing industry that the capacitance of a cell capacitor, even in the gigabit storage range, should be at least 30 femtofarad. One approach for increasing the capacitance while maintaining high-density integration of the storage cells is directed toward the shape of the capacitor electrode. In this approach, the polysilicon layer implementing the capacitor electrode can have protrusions, fins, cavities, etc., to increase the capacitance while maintaining the small area occupied on the substrate surface.

For example, Fazan et al., in U.S. Pat. No. 5,278,091, describe a capacitor over bit line (COB) storage node featuring a hemispherical grained (HSG) polysilicon layer on the storage node, which provides increased surface area.

However, as the chip density increases beyond the gigabit range and the minimum feature size approaches the 0.1 $\mu$m scale, it is likely that one will observe a bridge problem between the adjacent storage nodes in a DRAM cell capacitor. Since a bridge between the adjacent storage nodes can cause twin-bit and multi-bit failures in the manufacture of high-density DRAMs, it is crucial to resolve the bridge phenomena before the implementation of a stacked capacitor. In the case of a "box-type" stacked capacitor, increasing the distance between the adjacent storage nodes can alleviate the bridge problem. Increasing inter cell distance, however, defeats minimization.

Recently, a capacitor structure named "concave structure" has been proposed in an effort to resolve the above-mentioned bridge problem. The concave structure employs a sacrificial oxide to implement a cylindrical capacitor. A method of manufacturing the concave cylindrical capacitor is disclosed in a technical paper entitled, "A New Planar Stacked Technology (PST) for Scaled and Embedded DRAMs," by S. P. Sim, et al., published in the Technical Digest of International Electron Device Meeting (IEDM), pp. 597–600, 1996.

FIGS. 1A to 1D are schematic cross-sectional views illustrating various manufacturing steps for a traditional concave cell capacitor.

The prior art, as disclosed in FIGS. 1A–1D and 2A–2B, shows a method of manufacturing the concave cylindrical capacitor. The manufacturing method comprises providing an activation layer 56 having isolation elements 55 that define active regions 53; forming a contact pad 58 in electrical connection with active regions 53; providing an insulating film 54 over the activation layer 56 and the isolating elements 55; forming storage nodes 52 within insulating film 54; forming a contact 51 by employing a sacrificial oxide layer 50; depositing a polysilicon layer 57 over the layered structure, for serving as a storage node; filling the contact hole 51 with a protective oxide 59; performing a chemical mechanical polishing (CMP) process for cell isolation and removing the sacrificial oxide layer 50 and the protection oxide 59.

The manufactured device disclosed in the prior art, however, still suffers from a "lift-off" problem of the polysilicon layer. This is because some residue of the polysilicon layer is left on the surface of the wafer after the CMP process.

FIGS. 2A and 2B are schematic cross-sectional views illustrating the "lift-off" problem of the polysilicon layer as it occurs in the prior art.

Referring to FIGS. 2A and 2B, some residue 60 of the polysilicon layer 57 is left on the surface of the sacrificial oxide layer 50 if the contact hole 51 is not completely open. This is called "NOT OPEN" in the art due to the close spacing between the adjacent storage nodes 52.

Furthermore, some polysilicon patches 60 may detach from the polysilicon layer 57 and float during the CMP process. This can cause failure of the semiconductor device if the polysilicon layer sticks to the surface of the wafer. In addition, an alignment key may not be completely opened if the step height is relatively high, thereby causing similar "NOT OPEN" problems to be observed during the step of forming a buried contact.

In this case, the floating patches 60 or the residues of the patterned polysilicon can stick to the surface of the cell area, which consequently causes failure in the manufacture of a DRAM cell capacitor.

SUMMARY OF THE INVENTION

There is a need in the art for a cell capacitor that is not subjected to the limitations of the prior art.

Accordingly, it is a feature of the present invention to provide a cell capacitor for the manufacture of a DRAM.

Another feature of the present invention is to provide a method of manufacturing a cell capacitor, which resolves the "lift-off" problem of the polysilicon patches of the prior art.

Still another feature of the present invention is to provide a cell capacitor and a manufacturing method thereof, which resolve the "NOT OPEN" problem of the prior art.

Still yet another feature of the present invention is to provide a cell capacitor and a manufacturing method thereof, which cures the floating problem of polysilicon patches, which detaches from the sacrificial oxide layer.

A further feature of the present invention is to provide a cell capacitor and a manufacturing method of the same, which reduces the number of lithographic stages.

Yet another feature of the present invention is to provide a cell capacitor and a manufacturing method thereof, which prevents the misalignment between a storage node and a node contact.

As a result, it becomes possible to implement a concave cell capacitor having neither the "bridge" nor the "lift-off" problems of the prior art.

In accordance with a broad aspect of the present invention, provided is a method of manufacturing a cylindrical cell capacitor comprising forming a first insulating layer over a substrate, forming a first conductive layer on the first insulating layer, forming a first opening window to expose a portion of the first insulating layer by etching the first conductive layer, providing a first dielectric layer on at least an inner surface of the first opening window, forming a second conductive layer on the first dielectric layer, providing a spacer on sidewalls of the first opening window by etching the second conductive layer and first dielectric layer, forming a second opening window by etching the first insulating layer using the spacer as a mask, and forming a third conductive layer in at least the first and second opening windows to electrically connect with the substrate. Preferably, the step of forming the first opening window comprises forming a contact opening by selectively etching a portion of the second insulating layer and etching the first conductive layer using the contact opening as a mask.

The present invention further provides a method of manufacturing a cell capacitor wherein the lower electrode pattern and the lower electrode contact are simultaneously fabricated by a single photolithography step. According to an alternate embodiment of the present invention, the upper electrode of the cell capacitor is formed prior to the fabrication of the lower electrode.

In the manufacture of a cell capacitor in accordance with the present invention, a transistor having a source and drain is formed on a semiconductor substrate. A pad for a bit line is then formed on the source/drain region of the transistor. Thereafter, a first interlayer dielectric is deposited on the pad and covers the transistor. A pattern for the bit line is then formed through the first interlayer dielectric to electrically connect the pad to the bit line. A second interlayer dielectric is then formed on the first interlayer dielectric and the bit line pattern. A contact pad for the lower electrode of a cell capacitor is formed to electrically connect the source/drain region through the first and the second interlayer dielectrics. A third interlayer dielectric is formed on the contact pad and the second interlayer dielectric. Thereafter, a first conducting layer and a fourth interlayer dielectric are consecutively deposited on the third interlayer dielectric layer. A photoresist layer is then spin-coated on the fourth interlayer dielectric and patterned. Thereafter, the fourth interlayer dielectric is etched to open a window by employing the patterned photoresist layer as a mask. After eliminating the photoresist layer, the window is enlarged by wet-etching the fourth interlayer dielectric layer. The purpose of the wet etching step is to increase the surface area of the lower electrode. A trench for the lower electrode is then formed through a step of etching the first conductive layer, the purpose of which is to provide the upper electrode of a cell capacitor.

Preferably, the remaining first conductive layer, which was not eliminated in the previous etching step, will be employed as an upper electrode of a cell capacitor. Consequently, the trench patterns for the lower electrode and the upper electrode are simultaneously formed in a single photolithographic step.

The manufacturing process further includes forming a thin capacitor dielectric on the inner surface of the trench capacitor and depositing a second conductive layer on the thin capacitor dielectric for forming a spacer. Preferably, the second conductive layer is made from titanium nitride or is a stacked layer of titanium nitride and doped polysilicon. The above-mentioned second conductive layer is then anisotropically etched to form a spacer on the sidewalls of the trench. The spacer is used as a mask to open a contact opening, which exposes the underlying contact pad by etching the capacitor dielectric and the second interlayer dielectric layer. Preferably, the contact opening is formed in a self-aligned manner. A third conductive layer is then deposited in the contact opening in such a way that the trench and the contact opening will be completely filled with the third conductive layer. Finally, the third conductive layer is etched to form a cell capacitor by employing the fourth interlayer dielectric layer as a stopping layer. In this case, the fourth interlayer dielectric layer prevents electrical shortage between the upper and lower electrodes.

In a preferred embodiment of the present invention, a silicon oxynitride layer is further formed on the fourth interlayer dielectric as an anti-reflection coating (ARC) layer. In the case of employing an ARC layer, the manufacturing method of forming a trench for the lower electrode comprises forming an ARC layer on the fourth interlayer dielectric layer, forming a photoresist layer on the ARC layer, forming a contact opening through an etching step of the ARC layer, and after removing the photoresist layer patterning the fourth interlayer dielectric layer by a wet etching, employing the ARC layer as a mask. The fourth interlayer dielectric layer is etched to the side direction of the contact opening, and a first opening is formed to constitute a trench for the lower electrode of a cell capacitor by etching the first conductive layer.

In accordance with another broad aspect of the present invention, there is provided a semiconductor device comprising a substrate, a first conductive layer to electrically connect with the substrate, a first dielectric layer, a second conductive layer, wherein the first dielectric layer is formed on at least the sidewalls of the second conductive layer and the second conductive layer encloses the sidewalls of the first conductive layer.

Further features of the present invention will become apparent from a description of the fabrication process and a structure resulting therefrom, taken in conjunction with the accompanying drawings of the preferred embodiment of the invention. However, the disclosed preferred embodiments should not be taken to be limitative to the invention.

DETAILED DESCRIPTION OF THE PREFERRED EMBODIMENT OF THE INVENTION

Applicants' Korean Patent Application Nos. 99-12801 and 99-33767, filed Apr. 12, 1999 and Aug. 17, 1999, respectively, are incorporated herein by reference as if fully set forth herein.

The present invention will be explained in detail with reference to the accompanying drawings.

Figure 1A:
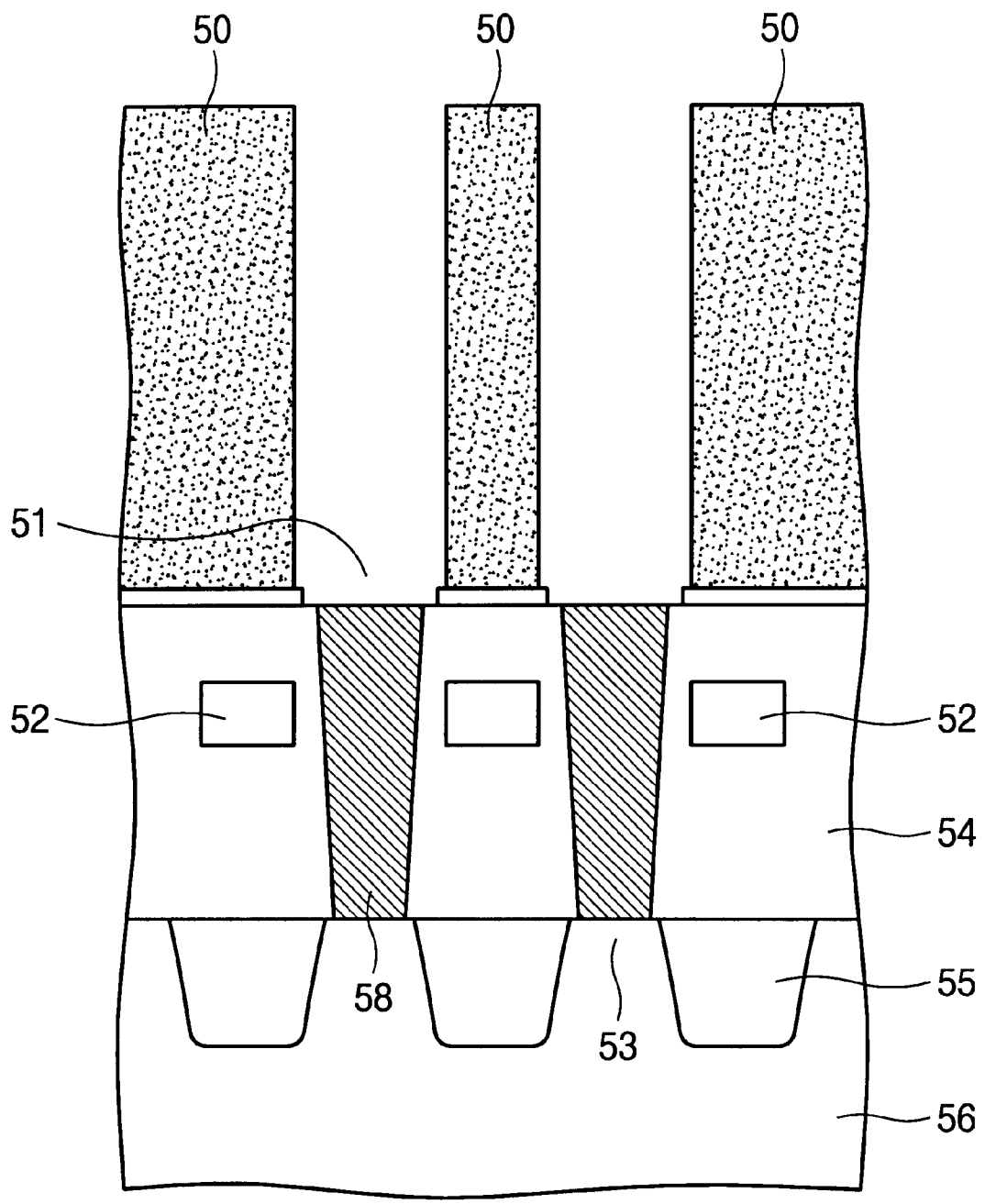
FIGS. 1A to 1D are schematic, cross-sectional views illustrating the various stages of manufacturing a cylindrical cell capacitor in accordance with the prior art.
Figure 1B:
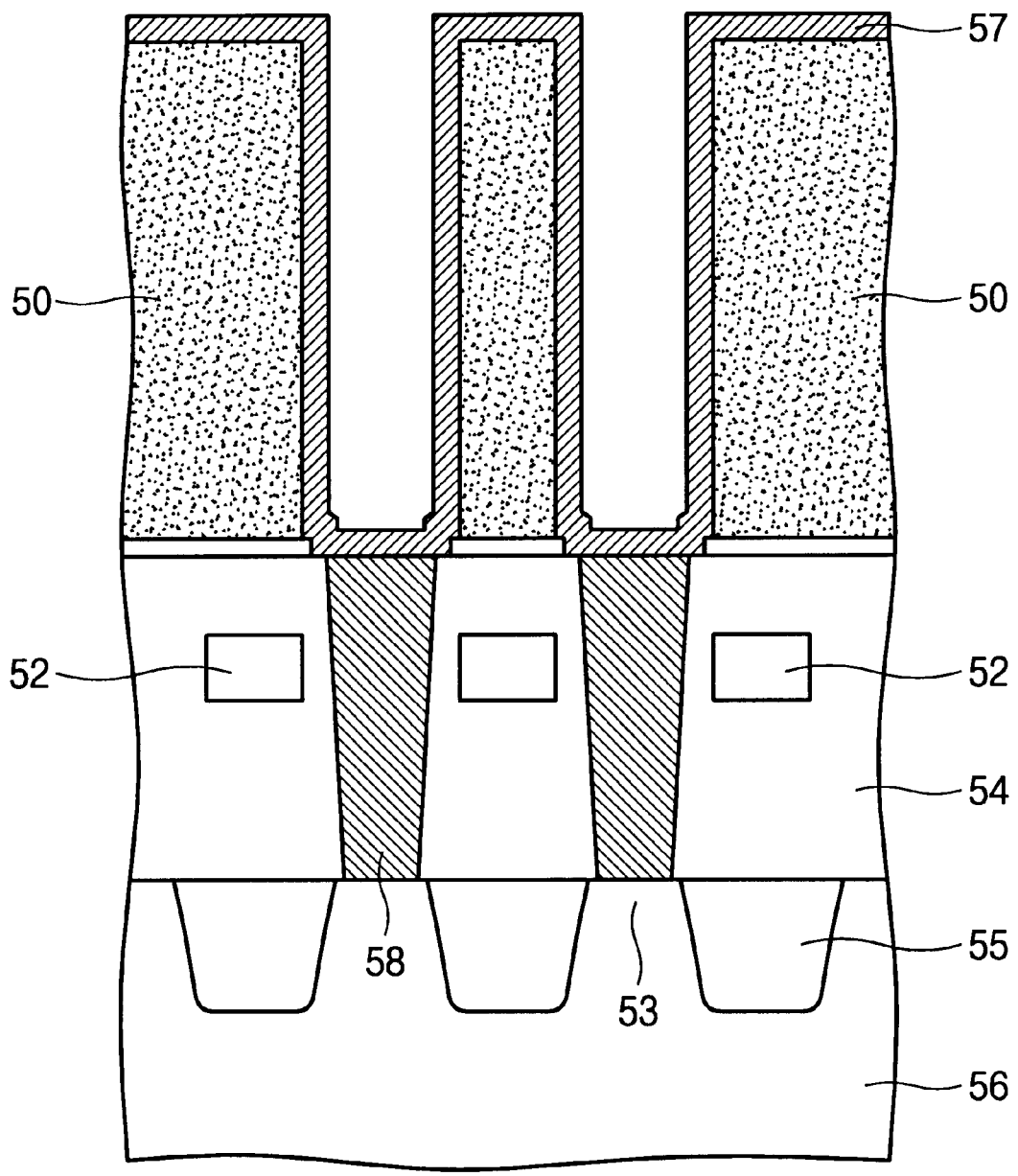
Figure 1C:
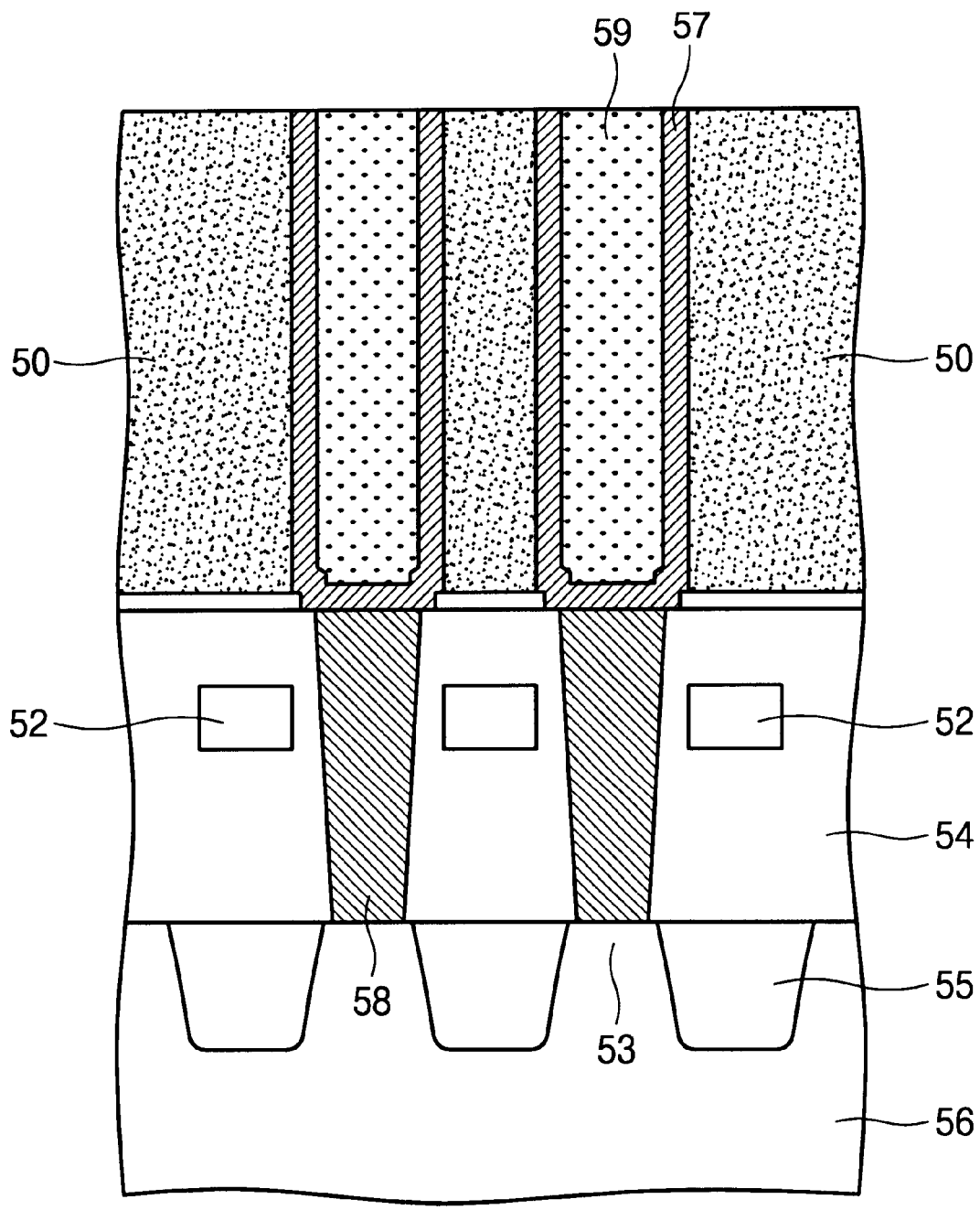
Figure 1D:
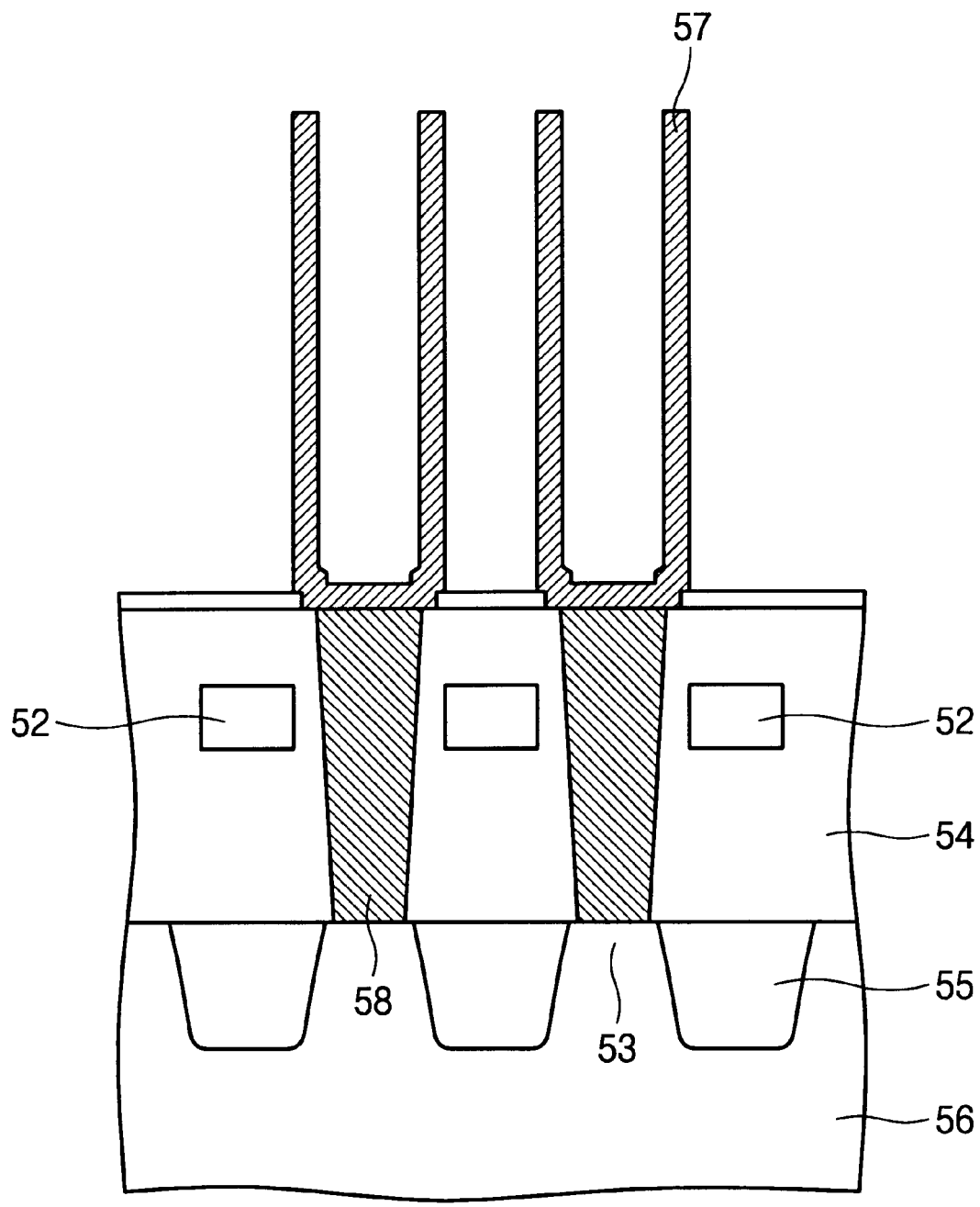
Figure 2A:
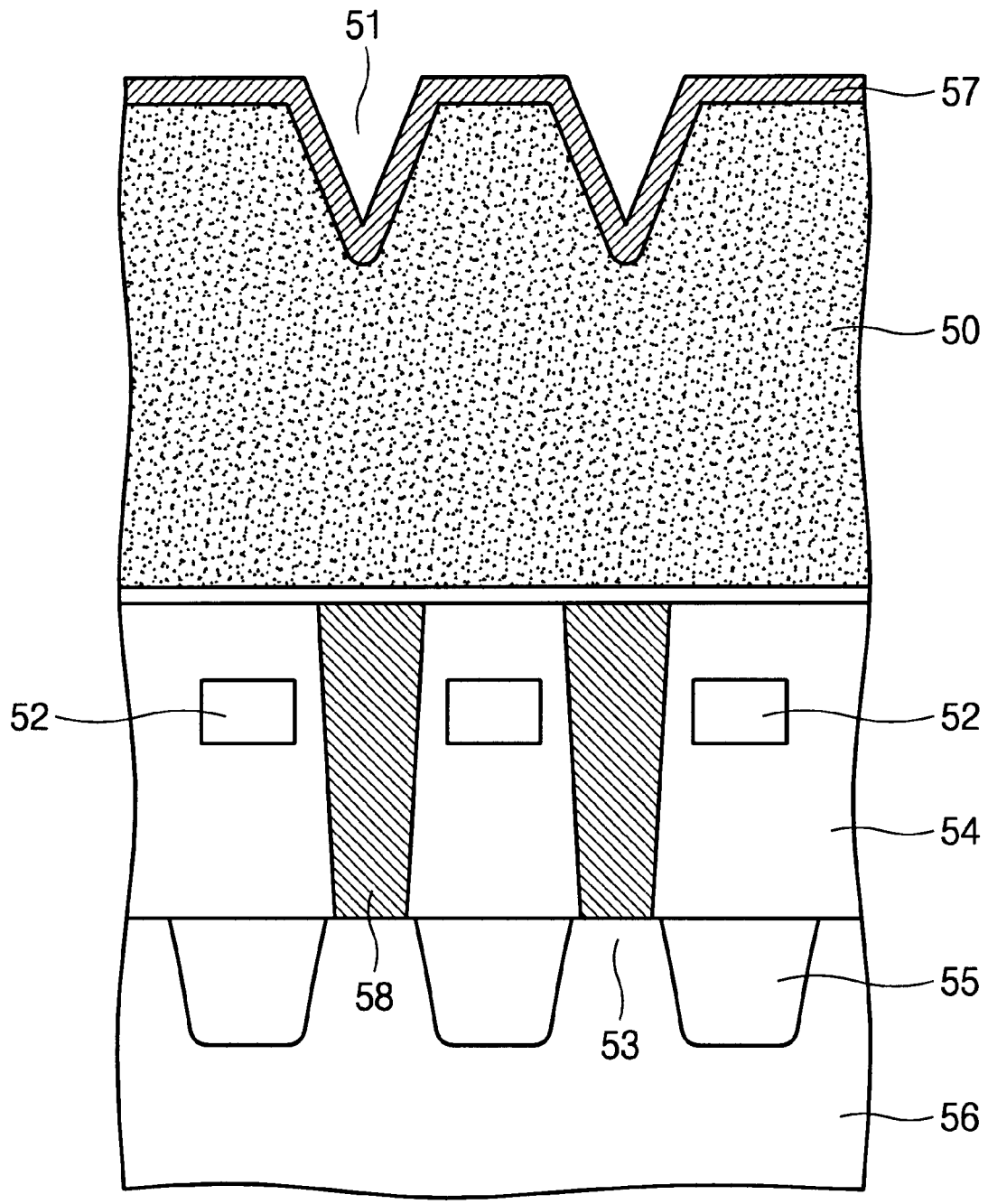
FIGS. 2A and 2B are schematic, cross-sectional views illustrating the "lift-off" problem occurring at the stage of removing the sacrificial oxide in accordance with the prior art.
Figure 2B:
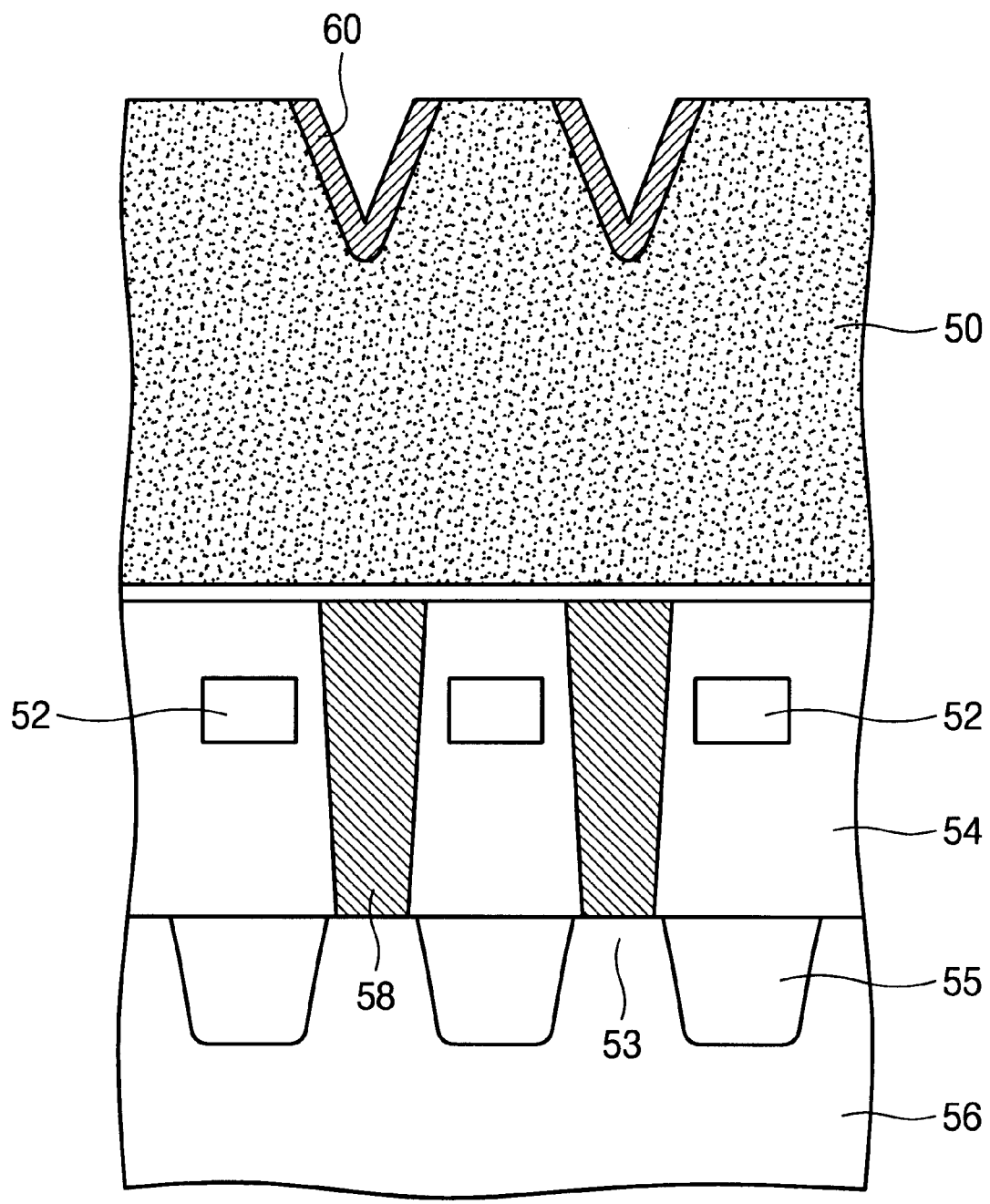
Figure 3:
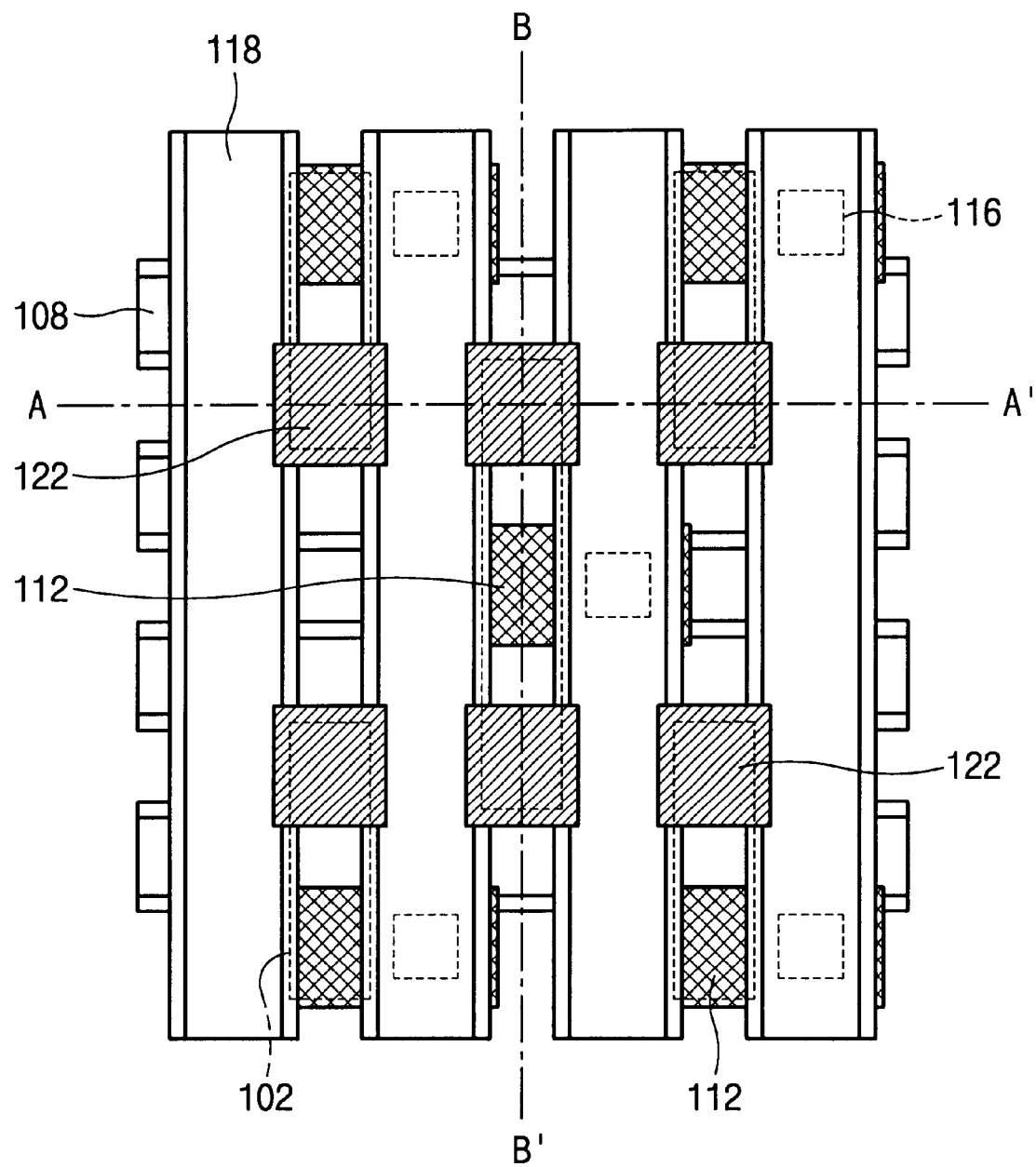
FIG. 3 is a schematic, cross-sectional view illustrating the layout of the wafer after forming the contact pad for the lower electrode in accordance with a preferred embodiment of the present invention.

FIG. 3 is a schematic, cross-sectional view illustrating the layout of the wafer after forming the contact pad for the lower electrode in accordance with first and second preferred embodiments of the present invention.

Referring to FIG. 3, multiple active regions 102 are formed on a semiconductor substrate. The active regions 102 are electrically isolated through isolation regions. Multiple word lines 108 are formed in parallel across the active regions 102.

Multiple bit lines 118 are also formed in parallel across the word lines 108 in between the active regions 102. The bit lines 118 are electrically insulated from the word lines 108 by a second insulating layer, and are electrically connected to the active regions 102 through the bit line contacts 116 and the contact pads 112 for the bit lines 118.

The contact pad 122 for the lower electrode is electrically connected to the active region 102 through a first, second, and third interlayer dielectric layers, to be discussed hereafter.

Figure 4:
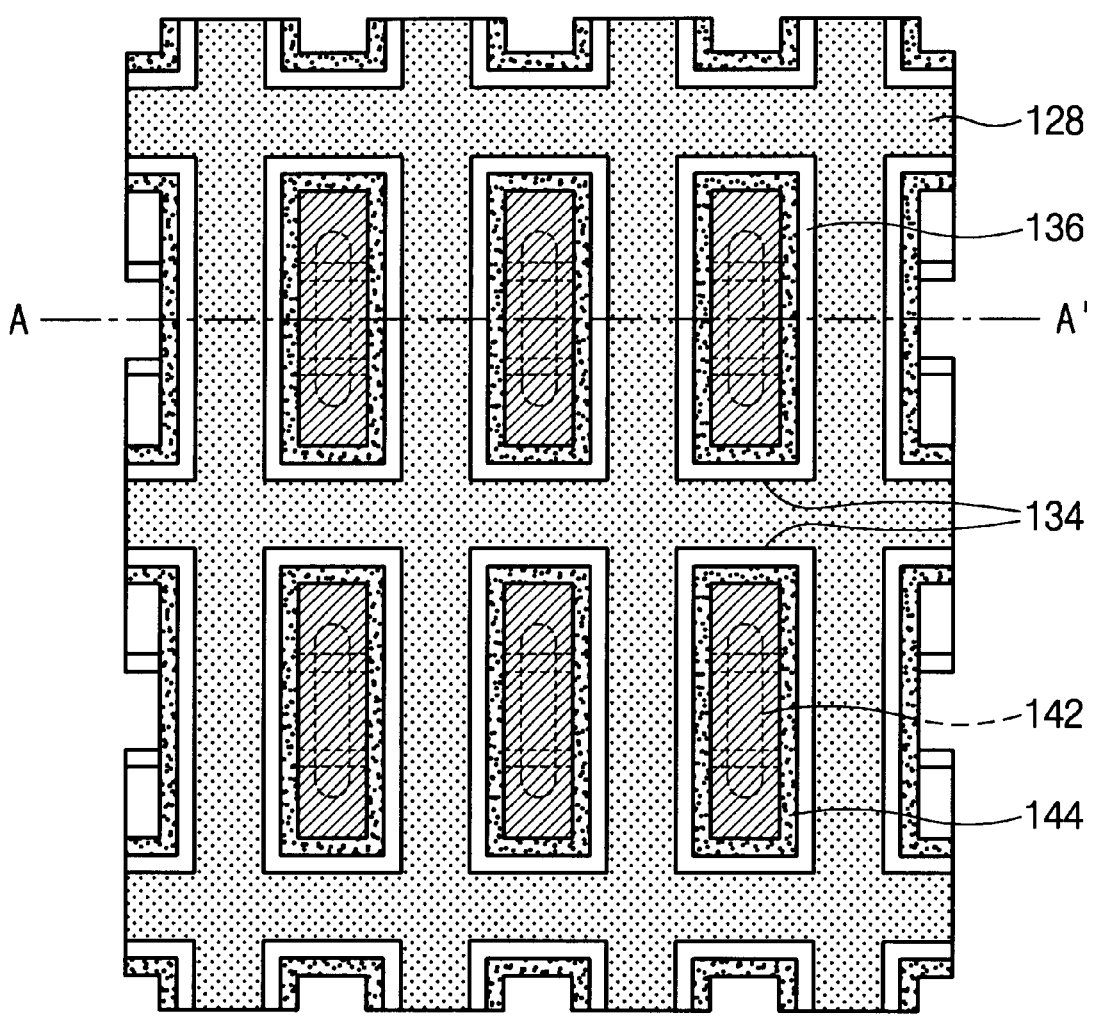
FIG. 4 is a schematic, cross-sectional view illustrating the layout of the wafer after patterning the upper electrode and the contact pad for the lower electrode in accordance with preferred embodiments of the present invention.

FIG. 4 is a schematic, cross-sectional view illustrating the layout of the wafer after patterning the upper electrode and the contact pad for the lower electrode, in accordance with the first and second preferred embodiments of the present invention.

Referring to FIG. 4, a contact window 134 for the lower electrode is surrounded by sequentially stacked an upper electrode (not shown) and a fifth interlayer dielectric 128. The upper electrode (not shown) and the contact window 134 for the lower electrode 144 are preferably fabricated in a single mask step. The contact window 134 for the lower electrode 144, which is formed between the upper electrodes, is arranged on the contact pad 142 for the lower electrode 144 in a parallel fashion to the bit lines 118 of FIG. 3.

Figure 5A:
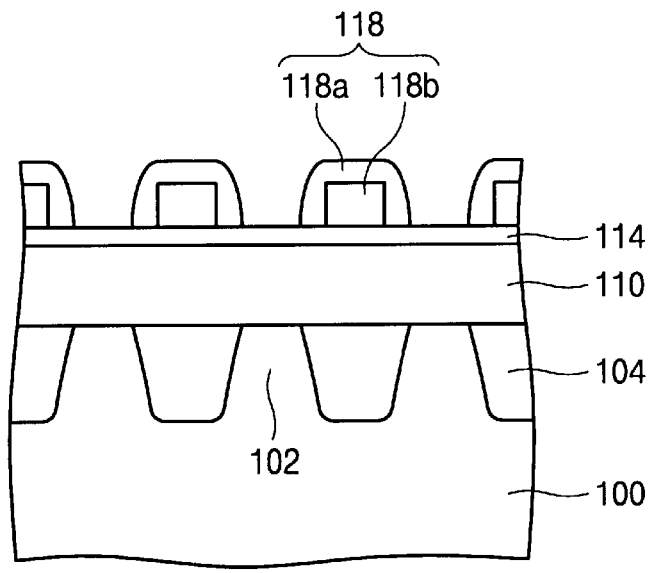
FIG. 5A is a schematic, cross-sectional view, taken along the A–A' line of FIG. 3, after forming a nitride spacer on the bit line in accordance with preferred embodiments of the present invention.
Figure 5B:
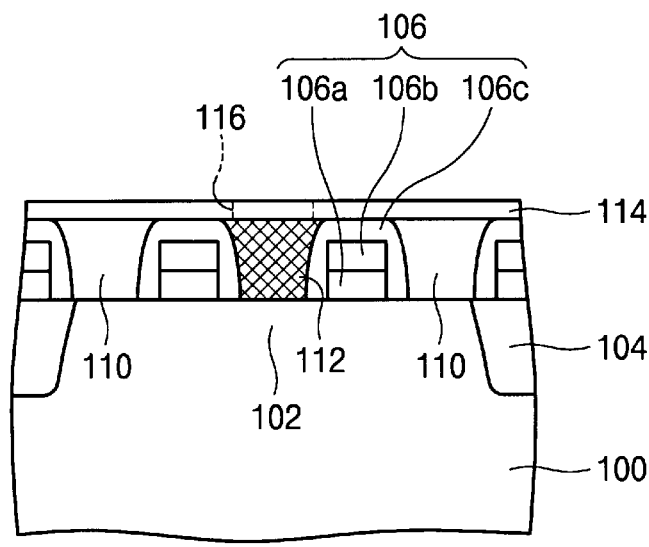
FIG. 5B is a schematic, cross-sectional view, taken along the B–B' line of FIG. 3, after forming the bit line contact in accordance with a first and a second embodiment of the present invention.

Referring to FIGS. 5A and 5B, device isolation regions 104 are implemented by using a shallow trench isolation (STI) technique. Multiple active regions 102 are defined by isolation regions 104 in semiconductor substrate 100. A well implantation, followed by a $V_T$ (threshold voltage) control implantation, is performed according to traditional methods. A word line, namely a gate of a transistor 106, is formed across the active region. The transistor 106 comprises a gate oxide (not shown), a stacked structure for a gate electrode 106a and 106b, a hard mask 106c, and source/drain regions (not shown).

In accordance with a preferred embodiment of the present invention, the stacked structure for the gate electrode is implemented by a polysilicon 106a and a metal silicide 106b. The hard mask 106c, which is preferably a silicon nitride layer, works as a protecting means for the gate of the transistor 106.

Again referring to FIGS. 5A and 5B, a first interlayer dielectric 110 is deposited so that the space between the transistors 106 is completely filled. A contact pad 112 for the bit line 118 is formed in order to increase the process margin. A photoresist layer (not shown) is formed on the first interlayer dielectric layer 110 and then patterned. The patterned photoresist layer works as a mask during the etching step of the first interlayer dielectric layer in order to expose the source/drain regions of the transistor. The exposed surface on the source/drain regions is now filled with a conductive material, thereby constituting the conductive pad 112, hereby called a contact pad 112 for the bit line 118.

Now, a second interlayer dielectric layer 114 is deposited on the wafer, and a bit line contact 116 is formed to expose the contact pad 112 for the bit line 118. Furthermore, multiple bit lines 118, running in parallel across the transistor 106, are formed on the second interlayer dielectric layer 114. The bit lines 118 are electrically connected to the underlying contact pad 112 through the bit line contact 116 in the second interlayer dielectric layer 114. Also referring to FIGS. 5A, 6A and 6B, the bit lines 118 comprise a conductive layer 118a and a protective layer 118b.

In accordance with a preferred embodiment of the present invention, the conductive layer 118a is implemented by a titanium nitride or a tungsten layer. The protective insulating layer 118b may be formed of a silicon nitride layer, which functions as a selective mask during an etching step for forming a self-aligned contact for the lower electrode because of its excellent etch selectivity against a third interlayer dielectric layer 120.

After forming the bit line pattern, including bit lines 118, a silicon dioxide insulating film is deposited on the surface (not shown), followed by a chemical mechanical polishing (CMP) process for planarization.

Figure 6A:
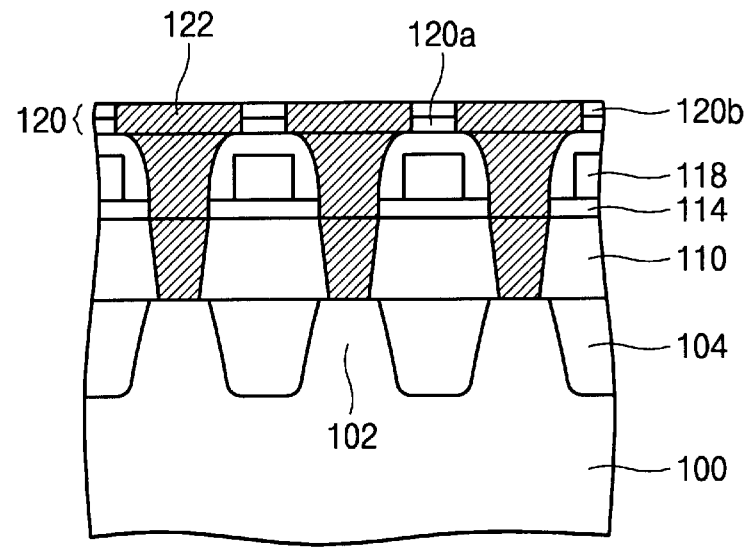
FIGS. 6A and 6B are schematic, cross-sectional views, taken along the A–A' and B–B' lines, respectively, of FIG. 3, after forming the nitride and oxide layers on the contact pad of the storage node in accordance with embodiments of the present invention.
Figure 6B:
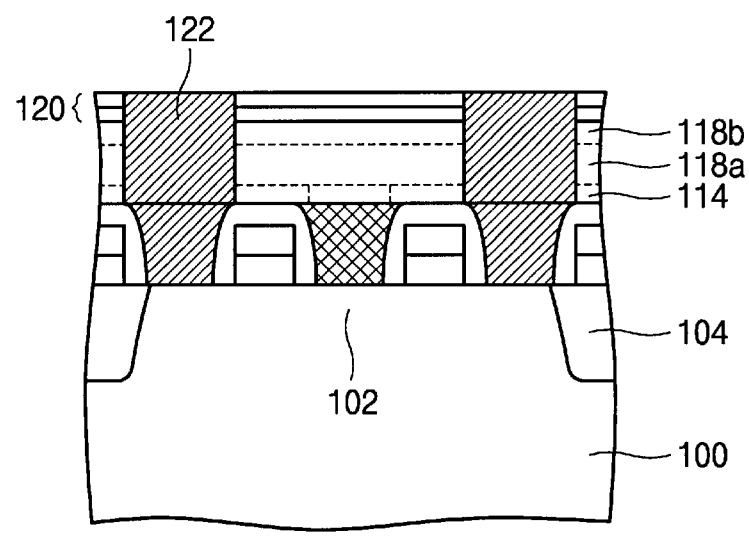
Figure 7:
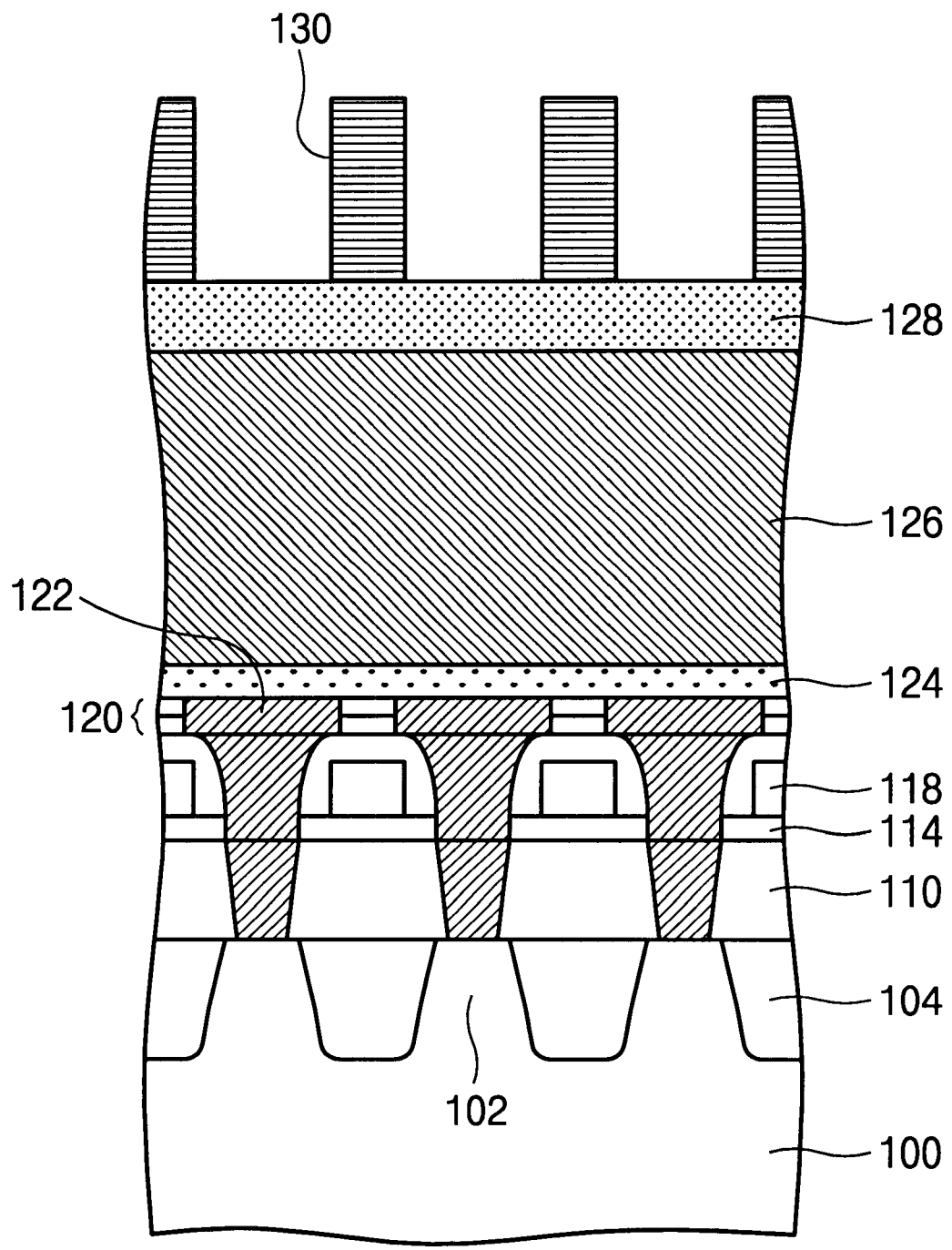
FIGS. 7 to 10 are schematic, cross-sectional views, taken along the A–A' line of FIG. 4, illustrating the various steps for manufacturing the cell capacitor in accordance with an embodiment of the present invention.

Thereafter, a third interlayer dielectric layer comprising a silicon nitride layer 120a and silicon oxide layer 120b is deposited and then patterned in such a way that an active region of the transistor 106 is exposed to form a contact pad for the lower electrode. A conductive material (for instance, doped polysilicon) is deposited on the third interlayer dielectric layer 120 and then is planarized by a CMP process step or an etch-back process to form a contact pad 122 for the lower electrode as shown in FIGS. 6A and 6B.

The subsequent processing steps, as described with reference to FIGS. 7 to 16, represent further unique features of the present invention.

FIGS. 7 to 10 are schematic, cross-sectional views illustrating the various processing steps in accordance with a first embodiment of the present invention, while FIGS. 11 to 16 provide a detailed explanation of a second preferred embodiment of the present invention.

A key feature of the present invention is that the upper electrode is formed prior to the formation of the lower electrode. Another unique feature of the present invention is that the pattern for the upper electrode, the trench for the lower electrode, and the lower electrode pattern are simultaneously fabricated by employing a single photolithography step.

FIGS. 7 to 10 are schematic, cross-sectional views, taken along the A–A' line of FIG. 4, illustrating the various processing steps subsequent to the steps corresponding to those steps depicted in FIGS. 5 and 6, and in accordance with a first preferred embodiment of the present invention.

Referring to FIGS. 7 to 10, a fourth insulating film 124 is formed on the contact pad 122 and the third interlayer dielectric 120. A conductive layer 126 for the upper capacitor electrode is formed on the fourth insulating film 124. The thickness of the conductive layer 120 determines the height of the lower electrode of a cell capacitor, thereby determining the magnitude of the capacitance for the capacitor. The conductive layer 126 is preferably a doped polysilicon layer. Thereafter, a fifth interlayer dielectric 128 is deposited on the conductive layer 126 in order to isolate the lower electrode of the cell capacitor. A patterned photoresist layer 130 is formed on the fifth interlayer dielectric 128 in order to form the upper electrode of the cell capacitor. As shown in FIG. 4, the upper electrode pattern 132 is formed by etching the fifth interlayer dielectric 128 and the conductive layer 126 using the patterned photoresist layer 130 as a mask. At the same time, a trench 134 is formed in a self-aligned manner to the contact pad 122, for the lower electrode.

In accordance with a preferred embodiment of the present invention, a hemispherical grain (HSG) may be formed on a surface of the upper electrode 132 in an effort to increase an effective surface area of the cell capacitor. Since the capacitance of the cell capacitor exhibits a dependence on the surface area of the lower electrode, it is desirable to enlarge a size of the trench opening. Preferably, the size of the trench opening is enlarged by isotropically etching the opened fifth interlayer dielectric layer 128, which is preferably an oxide layer, after removing the photoresist layer 130. When the conductive layer 126 is anisotropically etched, by employing the enlarged opening as a mask, a relatively larger trench may be formed in comparison to the size of the opening defined by the patterned photoresist. The enlarged trench opening, due to the wet etching step, has an effect of relaxing the design rule at a photolithography step.

Preferably, an ARC layer is formed on the fifth interlayer dielectric layer 128. A preferred ARC layer is a silicon oxynitride (SiON) layer. The silicon oxynitride (SiON) layer works as a mask for the fifth interlayer dielectric layer 128 during the wet etch step and helps to etch only the side of the fifth interlayer dielectric layer 128.

Thereafter, a capacitor dielectric film 136 is formed in the trench 134, on the patterned upper electrode. A conductive spacer is formed on the sidewalls of the upper electrode (the sidewalls of the trench 134) by forming conductive layers 138 and 140 on the patterned upper electrode, and anisotropically etching the conductive layers 138 and 140 for the lower electrode and the capacitor dielectric film 136. The conductive layers 138 and 140 may be implemented by a stacked structure of a titanium nitride layer as conductive layer 138 and a doped polysilicon layer as conductive layer 140. The thickness of the titanium nitride layer, conductive layer 138, may be in the range of 50~1000 Å. In another preferred embodiment in accordance with the present invention, only the titanium nitride layer, conductive layer 138, is used for the conductive layer of the lower electrode.

Figure 9:
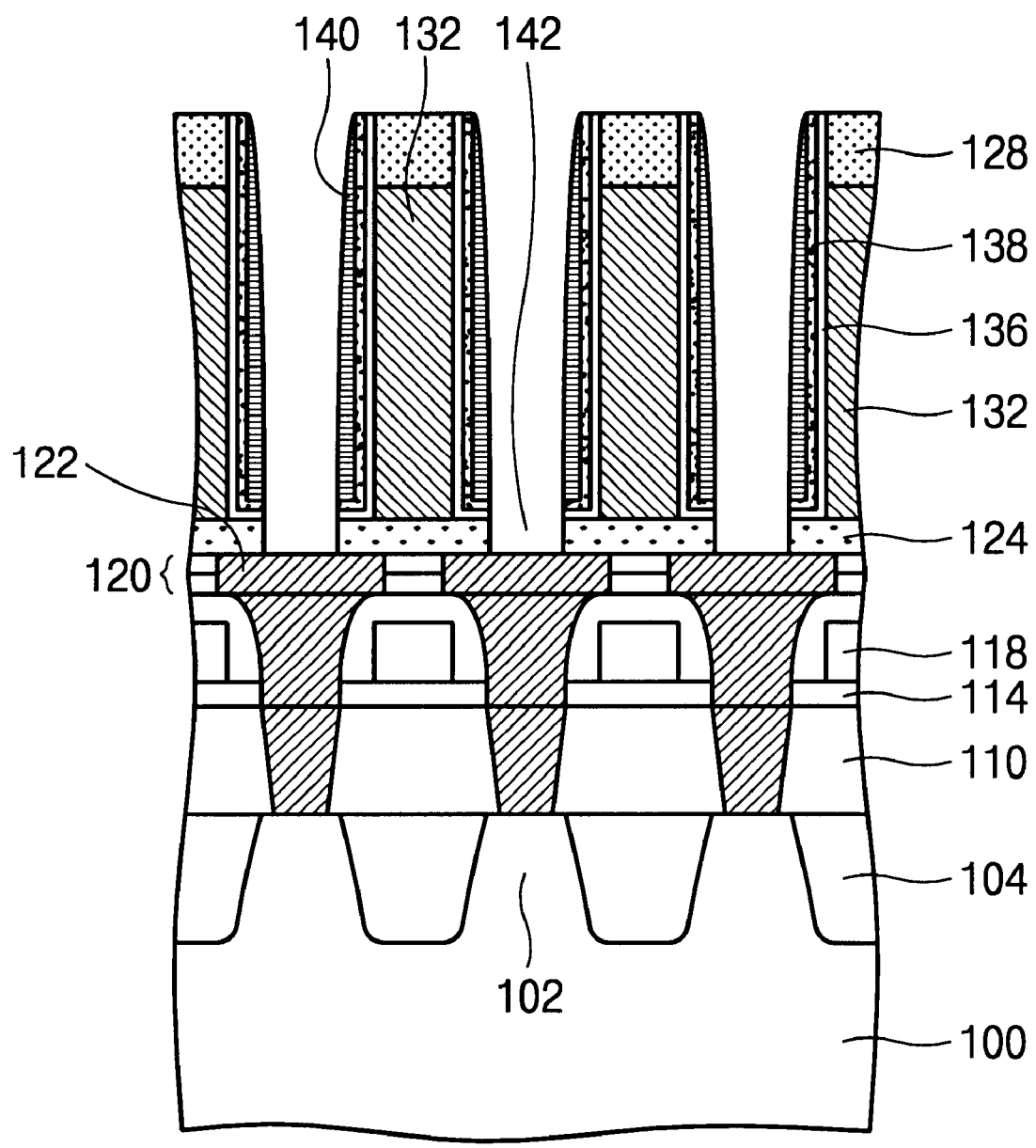
Figure 10:
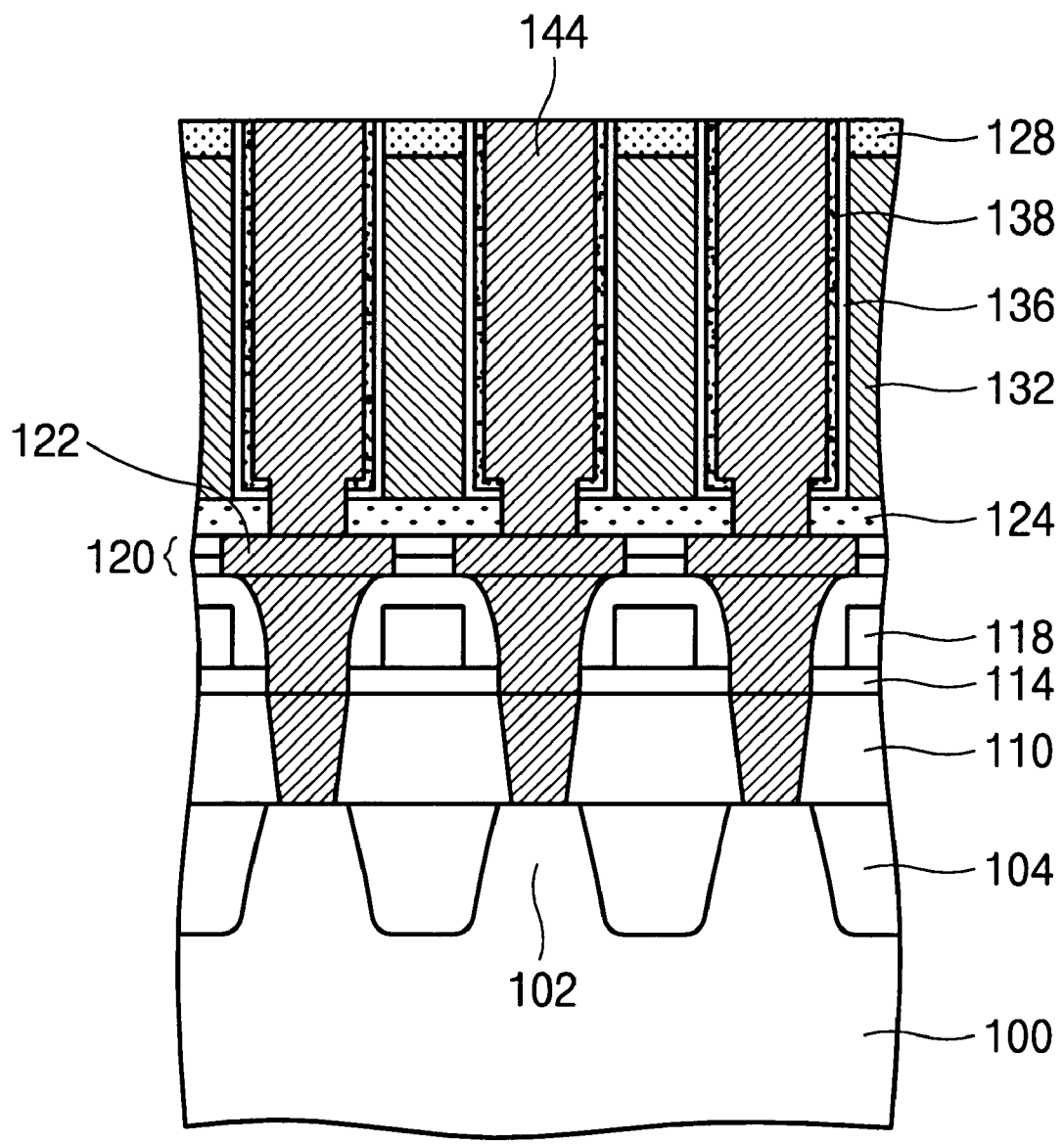

As shown in FIG. 9, a contact 142 for the lower electrode is formed to expose the contact pad 122 by etching the fourth insulating film 124 (a bottom layer of the trench 134) with the conductive spacer mask. In this case, the contact 142 for the lower electrode is formed in a self-aligned manner to the trench 134. Thereafter, as shown in FIG. 10, a conductive layer 144 is deposited so that the trench 134 is completely filled with the conductive layer 144. Now, the lower electrode for each cell capacitor is separated through an etching step of the fifth interlayer dielectric layer 128 by an etchback or CMP process. In accordance with the present invention, the fifth interlayer dielectric layer 128 may be completely removed. Furthermore, in another embodiment of the present invention, the fifth interlayer dielectric layer 128 is partially removed by the above-mentioned etch-back or CMP process. Also, the conductive layer for the lower electrode may be implemented with a doped polysilicon layer.

As shown in FIG. 10, a cell capacitor in accordance with a first embodiment of the present invention comprises an upper electrode being buried in between the lower electrodes. The isolation between those upper and lower electrodes can be realized by using the fifth interlayer dielectric 128 on the upper electrode.

According to the first embodiment of the present invention, the trench for the lower electrode is formed simultaneously with the upper electrode pattern. Furthermore, since the polysilicon layer of the lower electrode is electrically connected to the contact pad of the lower electrode through the trench, the number of lithographic processing steps can be reduced. In other words, the three additional lithography steps employed in the prior art for forming the lower electrode contact, the lower electrode, and the upper electrode, can be reduced to a single step in accordance with the present invention. In addition, the lower electrode can be implemented in a self-aligned manner to the lower electrode contact.

FIGS. 11 to 16 are schematic cross-sectional views along the A–A' line of FIG. 4, illustrating the various processing steps subsequent to the steps depicted in FIGS. 5 and 6, in accordance with a second embodiment of the present invention.

Figure 11:
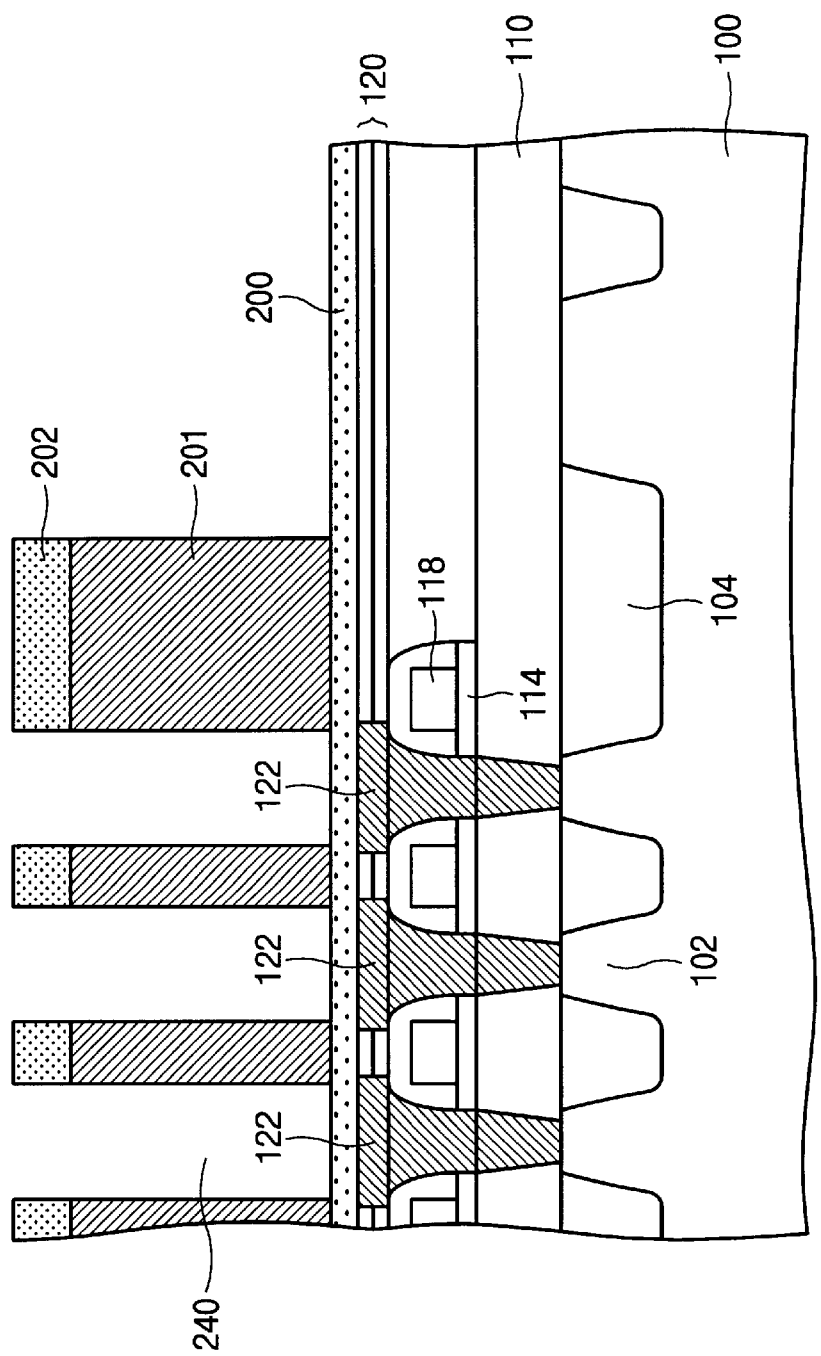
FIGS. 11 to 16 are schematic, cross-sectional views, taken along the A–A' line of FIG. 4, illustrating the various steps for manufacturing the cell capacitor in accordance with another embodiment of the present invention.

As shown in FIG. 11, the isolation region 104 for defining the active region in the cell array is first formed and then is subjected to ion implantation for well definition and subsequent $V_T$ control.

Thereafter, a transistor 106 comprising a gate (106a and 106b) and a gate spacer 106c (see FIG. 5B) is formed, and an insulating film 110 is deposited. A contact pad for the bit line 118 is formed in order to increase the process margin. After depositing the second interlayer dielectric 114 on the wafer, [the] a bit line contact is formed on a landing pad. A conductive layer (e.g., a stacked layer of titanium nitride and tungsten) is formed for defining the bit line 118. Following defining the bit line 118, a silicon nitride layer is formed to be employed as a self-aligned mask during formation of the contact pad for the storage node. Thereafter, a silicon oxide layer is deposited on the bit line 118.

After a planarization process by CMP or an etch-back process, a silicon nitride layer 120a and a silicon oxide layer 120b are sequentially deposited. The active region is then exposed to form a contact pad for the storage node.

Again referring to FIG. 11, a first insulating film 200 is deposited on the contact pad 122. A silicon oxide layer may be employed for the first insulating film 200. After depositing the first insulating film 200, a first conductive layer 201 for a plate node (upper electrode) of the capacitor is formed. A second insulating layer 202 is then formed on the first conductive layer 201. The second insulating layer may be a silicon nitride layer. The first conductive layer 201 preferably a doped polysilicon layer. A first window 240 is then formed by etching the first conductive layer 201 and the second insulating layer 202 with the storage node pattern.

Figure 8:
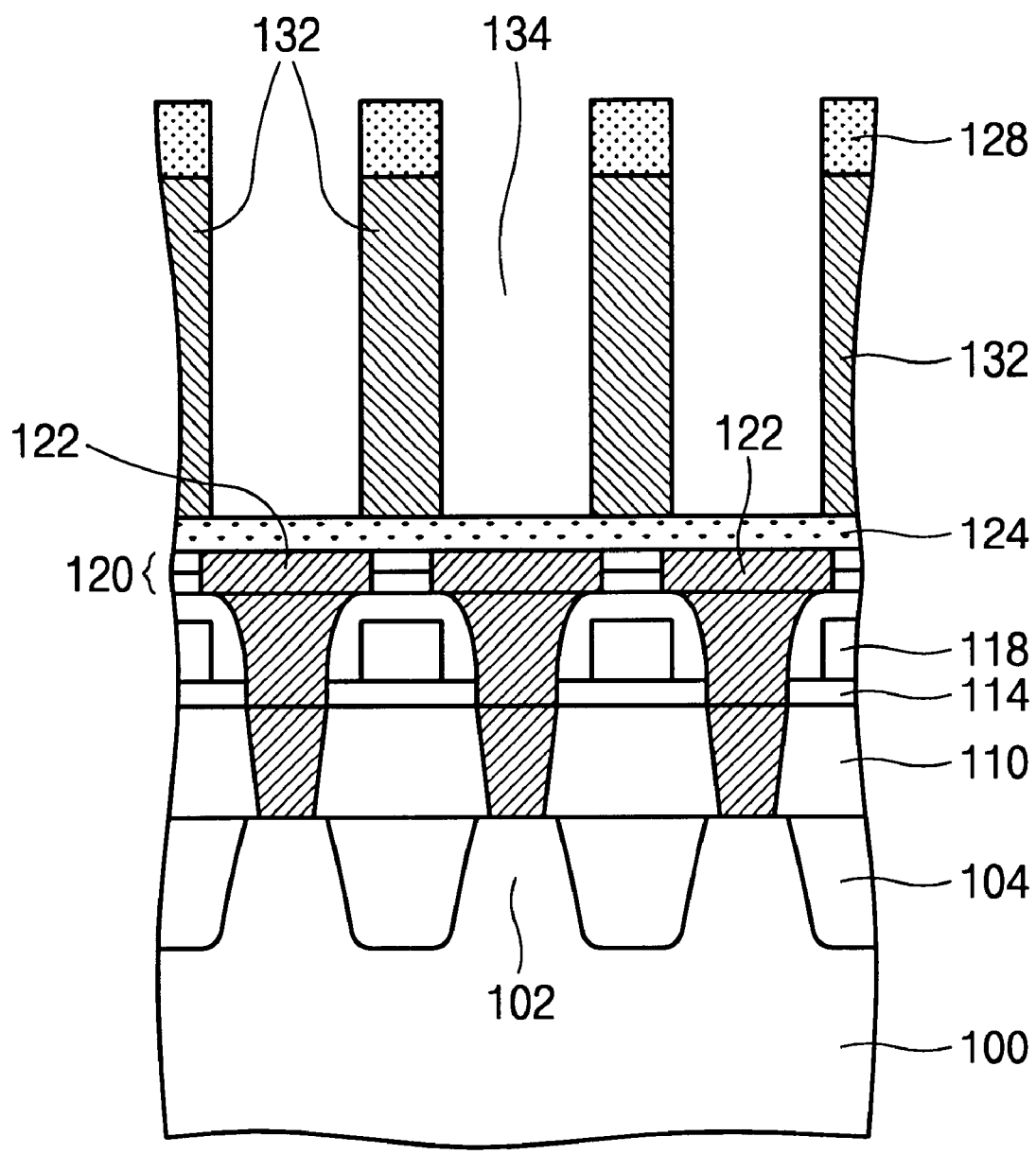

In a preferred embodiment, a hemispherical grain (HSG) may be formed on the surface of the first conductive layer 201. It should be noted that the first insulating layer 200 depicted in FIG. 11 corresponds to a fourth interlayer dielectric layer in a first embodiment as depicted in FIG. 8. However, for convenience in explaining the second embodiment of the present invention, it will be referred to as a first insulating layer. Likewise, the conductive layer 201, the second insulating layer 202, and the first window 240, all depicted in FIG. 11, correspond to the upper electrode pattern 132, the fifth interlayer dielectric 128, and the trench 134 for the lower electrode of FIG. 8, respectively.

In accordance with the second embodiment of the present invention, a process for enlarging the size of the first window 240 may be applied. For example, after forming an opening by anisotropically etching the second insulating layer 202, a wet etch step for etching the second insulating layer 202 may be performed to increase the size of the opening. Furthermore, an ARC layer may be applied to the second insulating layer 202.

Figure 12:
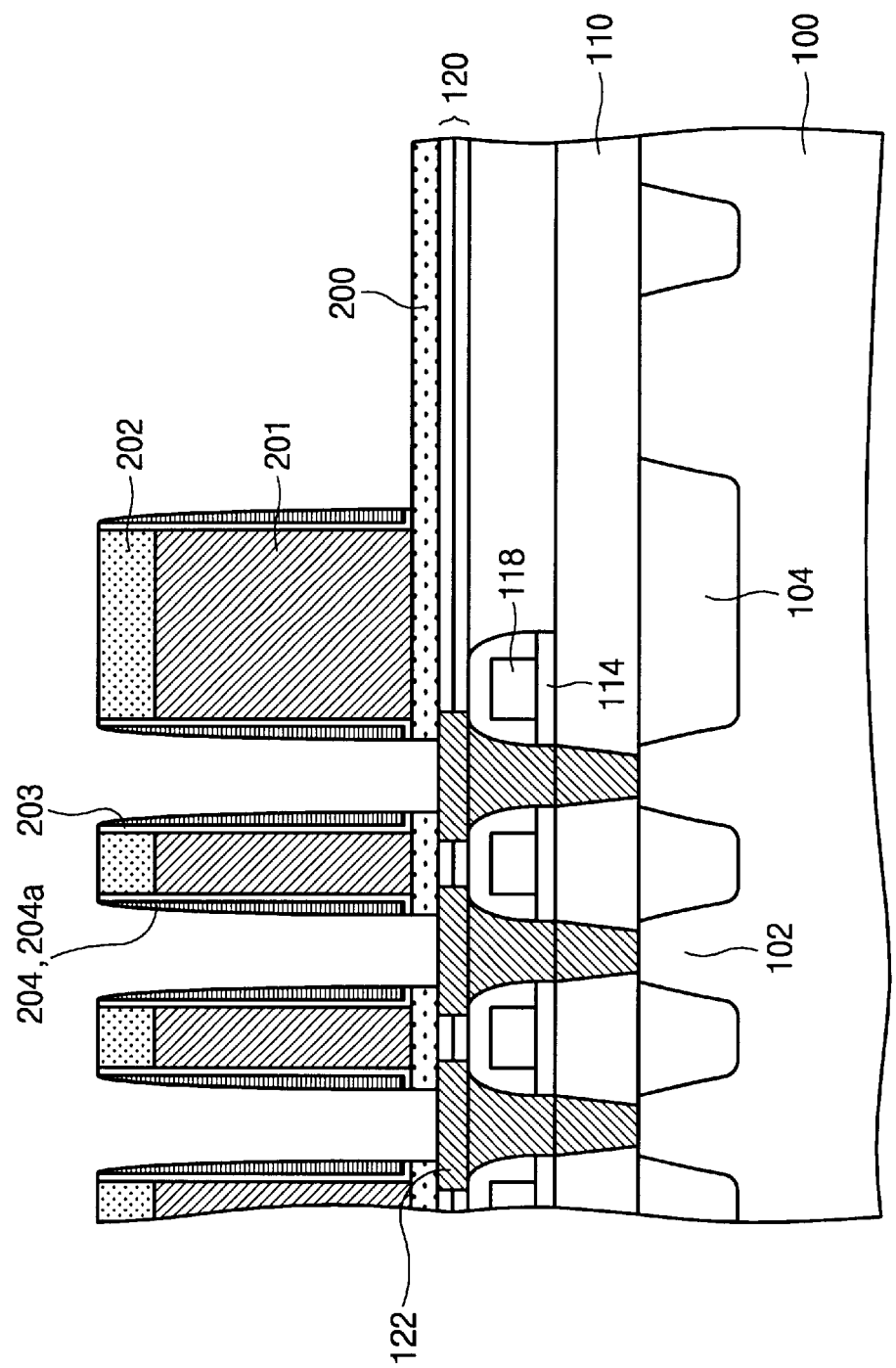

Referring to FIG. 12, a spacer comprising a first capacitor dielectric layer 203 and a second conductive layer 204 is formed on sidewalls of the conductive layer 201. By anisotropically etching the first capacitor dielectric layer 203 and the second conductive layer 204, a cylindrical structure is formed. The second conductive layer 204 may be either a doped polysilicon or a combination of titanium nitride and polysilicon. The second conductive layer 204 will be used as a first storage node contact 204a. Thereafter, a second window is opened to expose the contact pad 122 for the storage node by etching the first insulating layer 200 with a spacer mask comprising the first capacitor dielectric layer 203 and the first storage node contact 204a.

Figure 13:
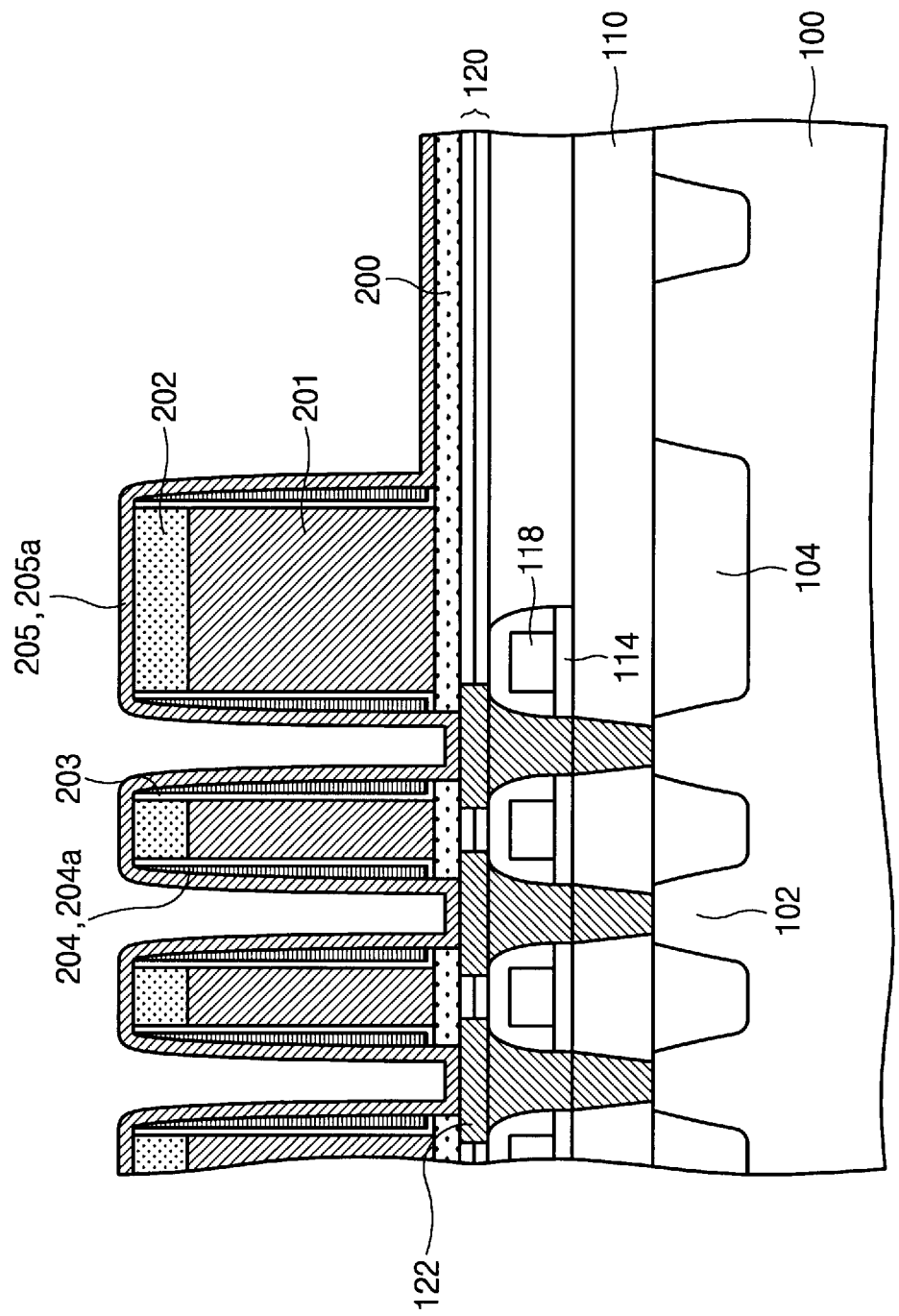

Referring to FIG. 13, a third conductive layer 205 is formed on the exposed contact pad 122 and the first storage node contact 204a, thereby forming a second storage node 205a, which is electrically connected to the contact pad 122. The third conductive layer 205 may be a doped polysilicon layer.

Figure 14:
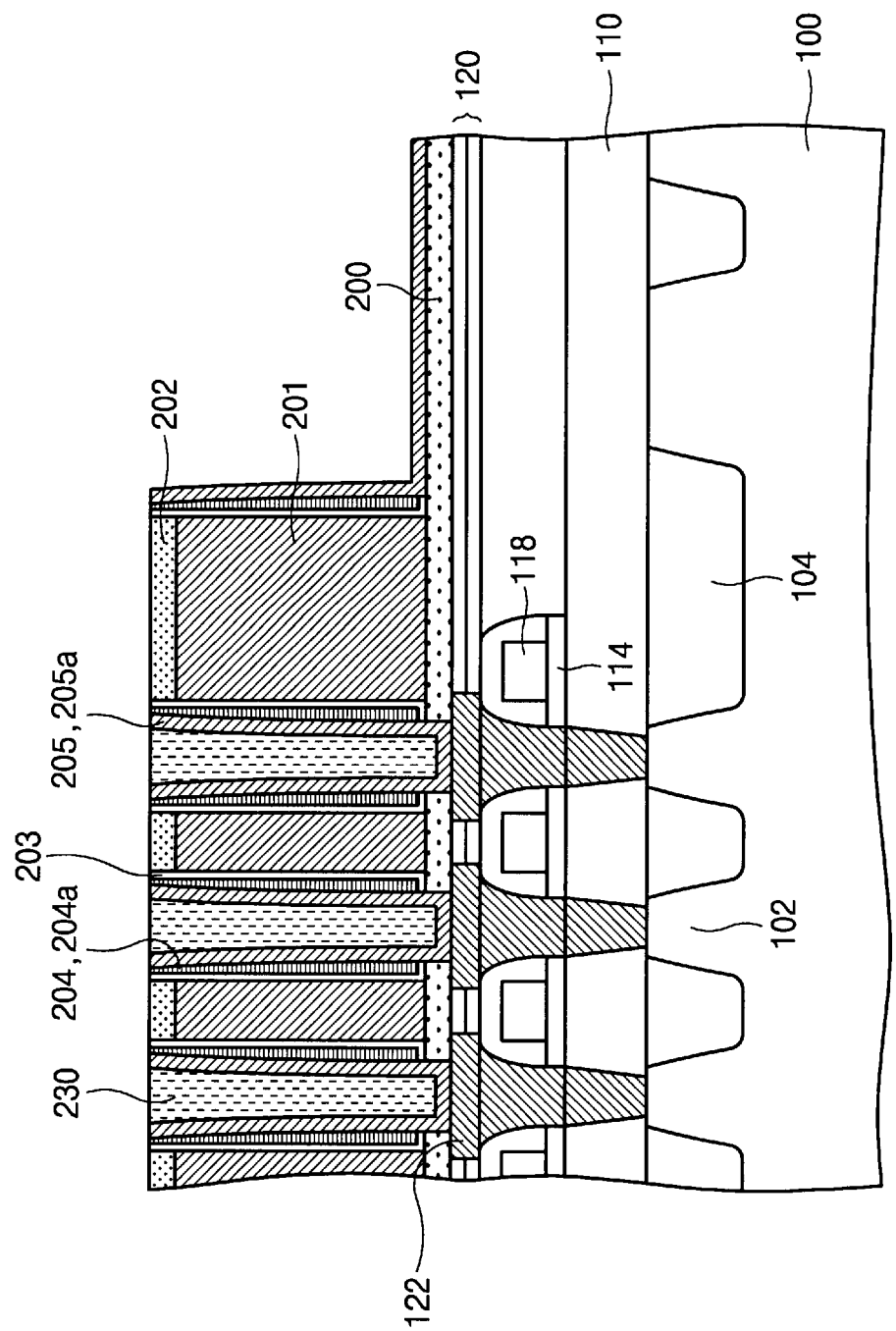

Referring to FIG. 14, a third insulating layer 230 is deposited to completely fill the first window 240 on the second storage node 205a. A node separation is performed, after applying the third insulating layer 230, by a CMP process or an etch-back process.

The third insulating layer 230 should have good step coverage. In addition, the node separation can be realized by etching the second insulating layer 202 either partially or completely.

Figure 15:
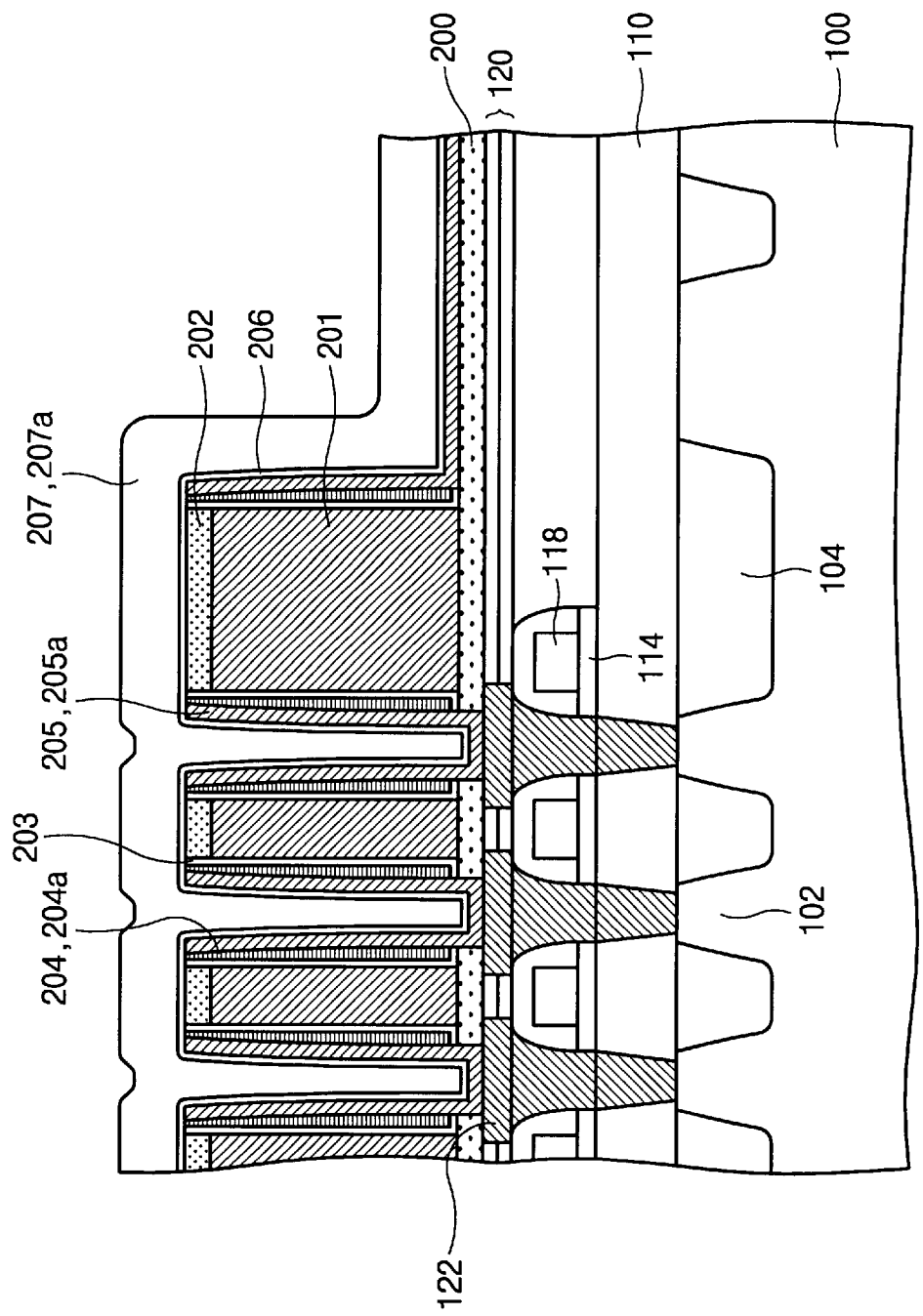

Referring to FIG. 15, a second capacitor dielectric 206 is formed on the second storage node contact 205 after eliminating the third insulating layer 230. The third insulating layer 230 can be eliminated using LAL 500 solution.

In this case, since the first conductive layer 201 connects the storage nodes, the "lift-off" problem is not observed as it is in the prior art. With reference to FIG. 15, a fourth conductive layer 207 is formed to implement a second plate 207a on the second capacitor dielectric 206. The fourth conductive layer 207 may be a doped polysilicon layer.

Figure 16:
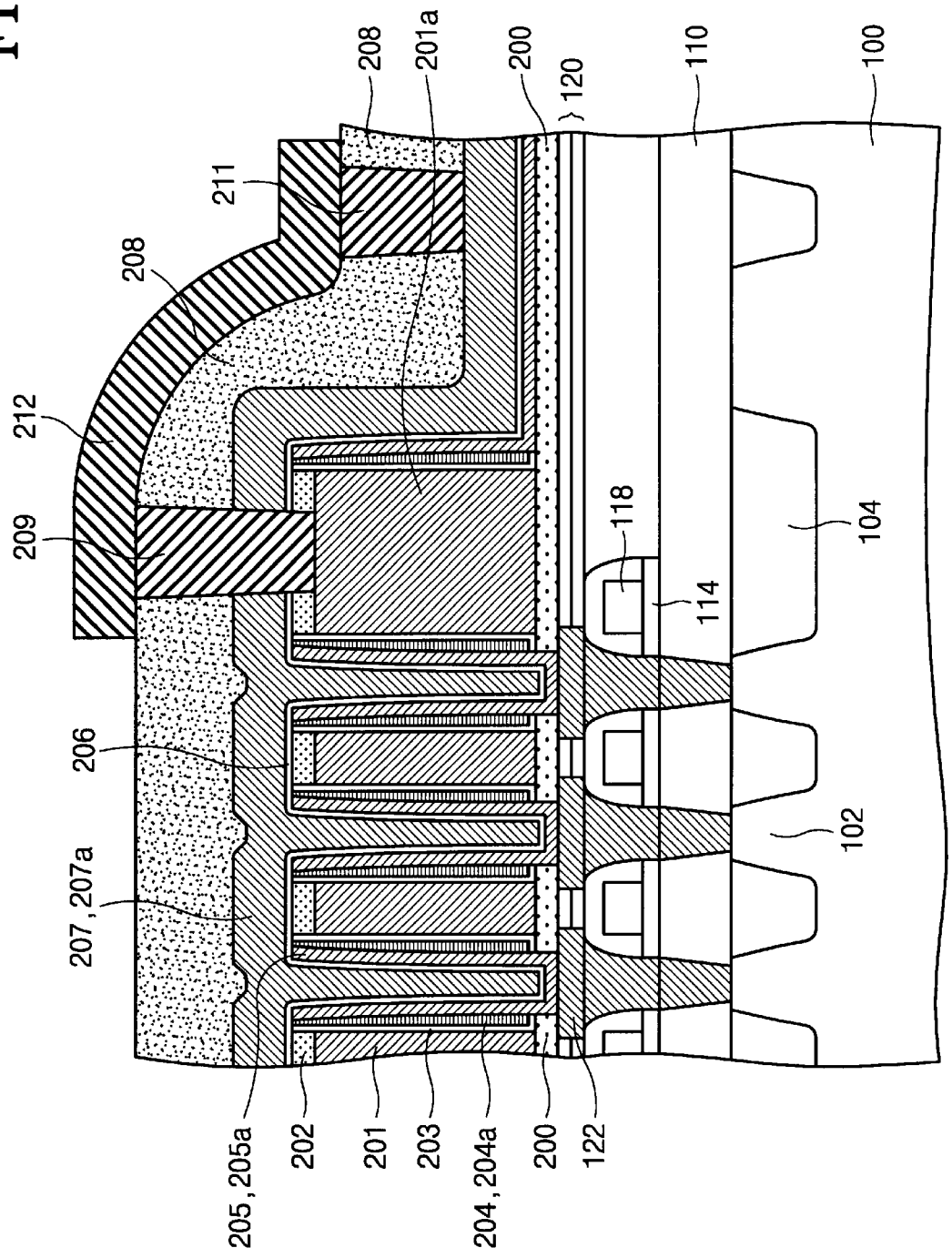

Referring to FIG. 16, a first plate 201a and a second plate 207a are electrically connected by forming a first plate contact 209 and a second plate contact 211 after depositing an insulating film 208 on the second plate 207a.

Consequently, the second preferred embodiment of the present invention employs an inner surface and an outer surface of a cylinder, by forming a first capacitor dielectric layer 203 on the inner surface and a second capacitor dielectric layer 206 on the outer surface of the first and second storage nodes 204a and 205a, respectively.

Although the invention has been illustrated and described with respect to exemplary embodiments thereof, it should be understood by those skilled in the art that various other changes, omissions and additions may be made therein and thereto, without departing from the spirit and scope of the present invention.

Therefore, the present invention should not be understood as limited to the specific embodiment set forth above but to include all possible embodiments which can be embodied within a scope encompassed and equivalents thereof with respect to the features set forth in the appended claims.

What is claimed is:

1. A method for manufacturing a capacitor, comprising the steps of:
   forming a first insulating layer over a substrate;
   forming a first conductive layer on the first insulating layer, wherein the first conductive layer is provided with a doped polysilicon layer for a plate of a capacitor;
   forming a first opening window to expose a portion of the first insulating layer by etching the first conductive layer;
   providing a first dielectric layer on at least an inner surface of the first opening window;
   forming a second conductive layer on the first dielectric layer;
   providing a spacer on sidewalls of the first opening window by etching the second conductive layer and the first dielectric layer;
   forming a second opening window by etching the first insulating layer using the spacer as a mask; and
   forming a third conductive layer in at least the first and second opening windows to electrically connect with the substrate.

2. The method as claimed in claim 1, further comprising the step of forming a second insulating layer on the first conductive layer; and wherein the step of forming the first opening window includes the steps of:
   forming a contact opening by selectively etching a portion of the second insulating layer; and
   etching the first conductive layer using the contact opening as a mask.

3. The method as claimed in claim 2, further comprising the step of enlarging the contact opening.

4. The method as claimed in claim 2, further comprising the step of forming the second insulating layer with silicon oxide or a stacked layer of silicon oxide and silicon oxynitride.

5. The method as claimed in claim 1, further comprising a step of forming a conductive pad intervened between the substrate and the first insulating layer; and
   wherein the step of forming the second opening window further comprises
   exposing the conductive pad.

6. The method as claimed in claim 1, further comprising the steps of providing the second conductive layer with either one or a combination of titanium nitride and polysilicon.

7. The method as claimed in claim 1, further comprising the step of providing the third conductive layer with a storage node for a capacitor, wherein the third conductive layer is a doped polysilicon layer.

8. The method as claimed in claim 2, wherein the method further comprises the steps of:

filling the first and second opening windows with the third conductive layer; and etching the third conductive layer to provide node separation.

9. The method as claimed in claim 4, wherein the step of etching the third conductive layer is done either by chemical mechanical polishing (CMP) or the etch-back process, which comprises an etching step performed in such a way that the second insulating layer is exposed.

10. The method as claimed in claim 1, wherein the step of forming the first opening window further comprises the step of forming a hemispherical grain (HSG) on the surface of the first conductive layer.

11. The method as claimed in claim 1, wherein the method further comprises the steps of:

forming a third insulating layer on the third conductive layer formed over the substrate including in the first and second opening windows;

removing the third insulating layer and the third conductive layer for the separation except the third conductive layer in the first and second contact opening windows;

forming a second capacitor dielectric layer on the third conductive layer; and forming a fourth conductive layer on the second capacitor dielectric.

12. The method as claimed in claim 2, wherein the method further comprises the steps of:

forming a third insulating layer on the third conductive layer formed over the substrate including in the first and second opening windows;

removing the third insulating layer and the third conductive layer for the separation except the third conductive layer in the first and second contact opening windows;

forming a second dielectric layer on the third conductive layer; and forming a fourth conductive layer on the second dielectric layer.

13. The method as claimed in claim 12, wherein the step of removing the third insulating layer and the third conductive layer comprising the steps of:

etching the third insulating layer and the third conductive layer such that the second insulating layer is exposed; and etching the remainder of the third insulating layer in the first and second opening windows.

14. The method as claimed in claim 12, wherein the method further comprises a step of electrically connecting the first conductive layer with the fourth conductive layer.

* * * * *